(12) United States Patent
Miyazawa

(10) Patent No.: US 6,714,082 B2
(45) Date of Patent: Mar. 30, 2004

(54) SEMICONDUCTOR AMPLIFIER CIRCUIT

(75) Inventor: Shigemi Miyazawa, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 10/175,497

(22) Filed: Jun. 20, 2002

(65) Prior Publication Data

US 2003/0001678 A1 Jan. 2, 2003

(30) Foreign Application Priority Data

Jun. 28, 2001 (JP) ........................................ 2001-196965

(51) Int. Cl.[7] ............................................... H03F 3/08
(52) U.S. Cl. ........................................ 330/308; 330/86
(58) Field of Search ........................... 330/86, 110, 260, 330/308; 250/214 A

(56) References Cited

U.S. PATENT DOCUMENTS 5,602,510 A * 2/1997 Bayruns et al. ........... 330/86 X
6,014,061 A * 1/2000 Tachigori .................... 330/308

* cited by examiner

Primary Examiner—Steven J. Mottola
(74) Attorney, Agent, or Firm—Armstrong, Westerman & Hattori, LLP

(57) ABSTRACT

A semiconductor amplifier circuit comprises a transimpedance amplifier for amplifying an input signal; a by-pass transistor connected between an input terminal of the transimpedance amplifier and the ground potential; a first resistor, one end of the first resistor being connected to an output terminal of the transimpedance amplifier; a capacitor connected between the other end of the first resistor and the ground potential; a second resistor connected between the other end of the first resistor and the gate of the by-pass transistor via an inverter; and a differential amplifier having a signal input terminal connected to the output terminal of the transimpedance amplifier and a reference-voltage input terminal connected to the other end of the first resistor.

4 Claims, 2 Drawing Sheets

SEMICONDUCTOR AMPLIFIER CIRCUIT

BACKGROUND OF THE INVENTION

1. Field of the Invention

The present invention relates to a semiconductor amplifier circuit. In particular, the present invention relates to a semiconductor amplifier circuit used as a component of a receiver for optical communication and having a high gain and a wide dynamic range.

2. Description of the Related Art

A receiver for optical communication has a function for converting an optical signal transmitted through a relay transmission path, such as an optical fiber, to an electrical signal by a light-receiving element and for amplifying the electrical signal by an amplifier circuit. The amplifier should have a high gain in order to amplify a weak signal which has been attenuated due to a long-distance transmission. Further, since the optical signal intensity widely varies depending on the optical transmission distance, a wide dynamic range suitable for this variation in the optical signal intensity is required.

A transimpedance amplifier 2, in which a feedback resistor 27 is connected in parallel to an operational amplifier 28, as shown in FIG. 2, is widely used as an amplifier circuit for optical communication. The transimpedance amplifier 2 converts a current signal input from a light-receiving element 1 to a voltage signal so as to amplify the signal. The gain of the transimpedance amplifier 2 depends on the resistance of the feedback resistor 27. Therefore, a high gain can be obtained by increasing the resistance of the feedback resistor 27. However, by increasing the resistance, the output voltage is likely to saturate and thus the dynamic range becomes narrow.

As described above, the gain and the dynamic range of the transimpedance amplifier depend on the value of the feedback resistor and are in a trade-off relationship. Thus, a high gain and a wide dynamic range cannot be realized at the same time.

FIG. 3 shows an example of a known amplifier circuit for optical communication including an improved transimpedance amplifier. As shown in FIG. 3, a DC voltage generating circuit 4 including a resistor 41 and a capacitor 42 connected in series is connected to the output terminal of the transimpedance amplifier 2. Also, a by-pass transistor 7 is connected to the input terminal of the transimpedance amplifier 2. The DC voltage generated in the DC voltage generating circuit 4 is applied to the gate of the by-pass transistor 7 via an inverter 5. Herein, the DC voltage generating circuit 4 generates a DC voltage whose value is substantially the same as the time-average value of the voltage signal output from the transimpedance amplifier 2.

According to the above-described configuration, the impedance of the by-pass transistor 7 varies according to the intensity of the current signal input from the light-receiving element 1, and thus the gain of the transimpedance amplifier 2 is adjusted. Therefore, the amplifier circuit shown in FIG. 3 has excellent characteristics in a gain and a dynamic range, compared to the transimpedance amplifier 2 shown in FIG. 2.

Further, the amplifier circuit shown in FIG. 3 amplifies the voltage signal output from the transimpedance amplifier 2 by a differential amplifier 3 and externally outputs the signal. As can be seen in FIG. 3, the DC voltage generated in the DC voltage generating circuit 4 is applied to a reference-voltage input terminal 36 of the differential amplifier 3. Accordingly, the voltage signal applied to a signal input terminal 35 of the differential amplifier 3 swings, with the center being a DC voltage level which is substantially equal to the time-average value, in accordance with the change of the optical signal intensity. As a result, the voltage amplitude output to the output terminal 37 and that output to the output terminal 38 are inverted with respect to each other. Therefore, the amplifier circuit shown in FIG. 3 is capable of externally outputting the voltage signal, which has an amplitude twice as much as a single-phase amplitude and which does not have distortion.

In general, an amplifier circuit for optical communication is integrated by using a compound semiconductor having an excellent high-frequency characteristic, such as gallium arsenide (GaAs). As a transistor for constituting the circuit, Schottky gate FET is used.

The Schottky gate FET is used as an input device for the differential amplifier 3 and the inverter 5 of the amplifier circuit shown in FIG. 3. The DC voltage generated by the DC voltage generating circuit 4 is applied to the gate of each of the FETs. Accordingly, a large gate leakage current is generated when the DC voltage exceeds the threshold voltage of the Schottky gate FETs.

In particular, when the gate leakage current of the FET used as the input device for the inverter 5 becomes large, the current applied to the resistor 41 of the DC voltage generating circuit 4 becomes large accordingly. As a result, a large potential difference occurs between both terminals of the resistor 41, and thus the DC voltage input to the reference-voltage input terminal 36 of the differential amplifier 3 is reduced. Accordingly, the DC voltage applied to the reference-voltage input terminal 36 of the differential amplifier 3 is lower than the time-average voltage signal applied to the signal input terminal 35. This causes a problem that the voltage signal input to the differential amplifier 3 is not normally amplified.

The above-described problem occurs because both of the DC voltage to be applied to the inverter 5 and the DC voltage to be applied to the differential amplifier 3 are generated by the DC voltage generating circuit 4. Accordingly, when the DC voltage to be applied to the reference-voltage input terminal 36 of the differential amplifier 3 is generated by another DC voltage generating circuit, the influence of the gate leakage current of the inverter 5 can be suppressed. In order to achieve this, however, a resistor and a capacitor for forming another DC voltage generating circuit must be fabricated on an amplifier circuit chip.

Generally, in this type of DC voltage generating circuit, an external microchip capacitor is used because a large capacitance is required to smooth an input voltage. Thus, as described above, the amplifier circuit chip becomes large when another DC voltage generating circuit is provided.

Alternatively, a DC voltage can be supplied from a DC voltage generating circuit provided outside the amplifier circuit chip to the reference-voltage input terminal of the differential amplifier in the amplifier circuit chip. In this method, however, a terminal for external connection must be provided in the amplifier circuit chip, which results in an increase in the size of the chip and high cost.

Further, in the amplifier circuit shown in FIG. 3, the by-pass transistor 7 is connected in parallel to the input terminal of the transimpedance-amplifier 2. Accordingly, the input capacitance of the transimpedance amplifier 2 increases by the gate capacitance of the by-pass transistor 7. This causes further deterioration in the frequency characteristic of the transimpedance amplifier 2 in a high-frequency region. The input capacitance of the transimpedance amplifier 2 can be effectively reduced when the gate width of the by-pass transistor 7 is made to be narrow. However, this causes the increase of the impedance of the by-pass transistor 7. As a result, the gain characteristic and the dynamic range characteristic of the amplifier circuit deteriorate.

SUMMARY OF THE INVENTION

Accordingly, it is an object of the present invention to improve the amplification characteristic of an amplifier circuit without causing an increase in the size of the amplifier circuit and an increase in the number of external terminals.

In order to overcome the above-described problems, a semiconductor amplifier circuit according to the present invention comprises a transimpedance amplifier for amplifying an input signal; a by-pass transistor connected between an input terminal of the transimpedance amplifier and the ground potential; a first resistor, one end of the first resistor being connected to an output terminal of the transimpedance amplifier; a capacitor connected between the other end of the first resistor and the ground potential; a second resistor connected between the other end of the first resistor and the gate of the by-pass transistor via an inverter; and a differential amplifier having a signal input terminal connected to the output terminal of the transimpedance amplifier and a reference voltage input terminal connected to the other end of the first resistor.

The semiconductor amplifier circuit may further comprise level shift means provided at least one of between the by-pass transistor and the input terminal of the transimpedance amplifier and between the by-pass transistor and the ground potential.

Preferably, the level shift means is a diode.

A light-receiving element may be connected to the input terminal of the transimpedance amplifier.

According to the present invention, a DC voltage is generated by the first resistor and the capacitor connected to the output terminal of the transimpedance amplifier. The generated DC voltage is supplied to the inverter via the second resistor and is also supplied to the reference-voltage input terminal of the differential amplifier.

Consequently, even when a current flows from the first resistor and the capacitor through the input unit of the inverter, the current is limited by the second resistor, and thus reduction in the DC voltage generated by the first resistor and capacitor can be suppressed. As a result, reduction in the DC voltage supplied to the reference-voltage input terminal of the differential amplifier can be suppressed, and the differential amplifier can normally amplify the voltage signal input from the signal input terminal so as to externally output the signal.

Also, according to the present invention, the level shift means connected to the by-pass transistor adjusts the source-drain potential, thereby controlling the impedance of the by-pass transistor. As a result, the gain characteristic and dynamic range characteristic of the amplifier circuit do not deteriorate even when the gate width of the by-pass transistor is narrowed in order to suppress deterioration in the frequency characteristic of the amplifier circuit.

DESCRIPTION OF THE PREFERRED EMBODIMENTS

Figure 1:
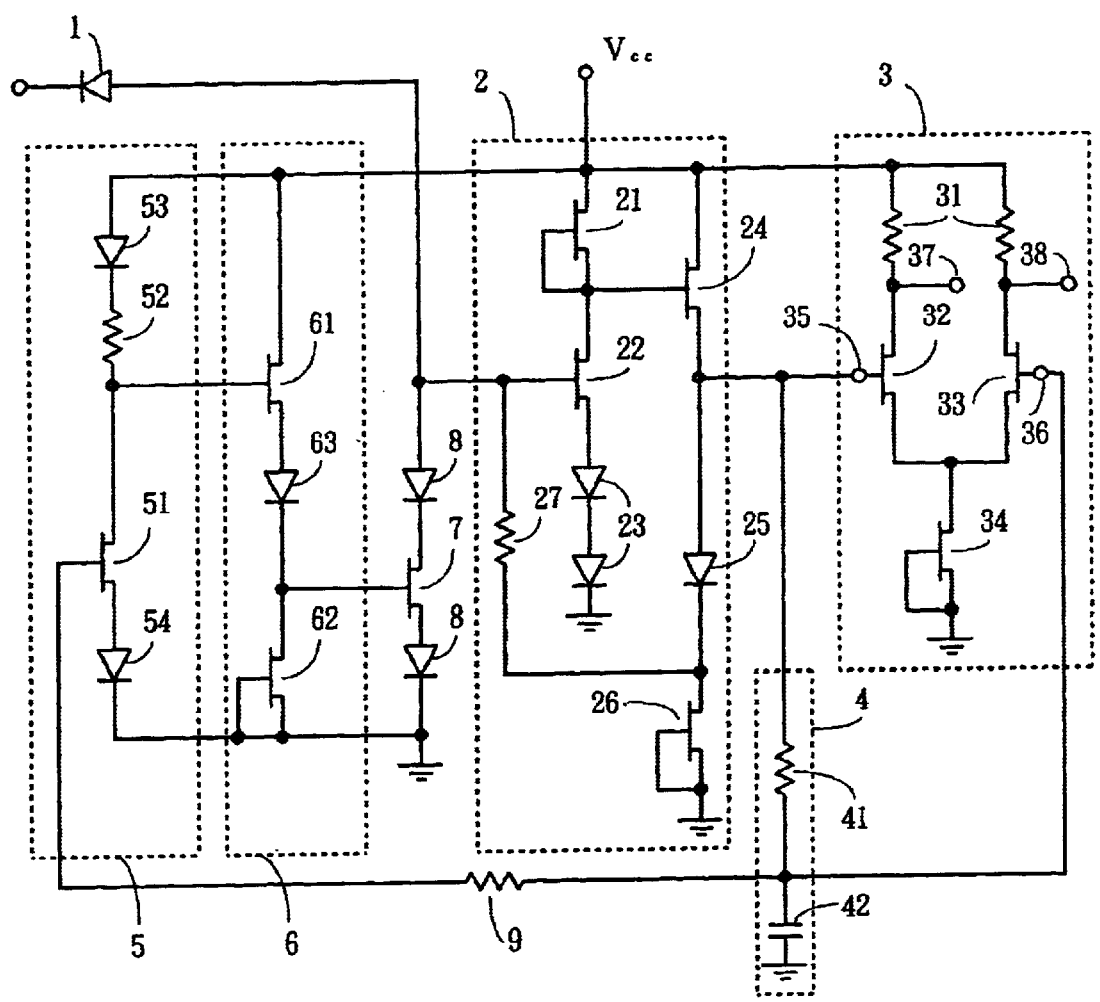
FIG. 1 shows an amplifier circuit according to an embodiment of the present invention.
Figure 2:
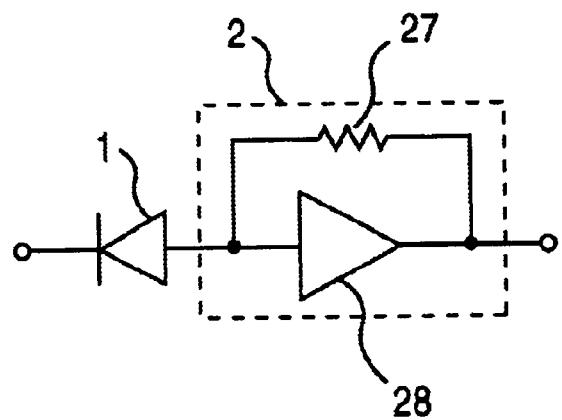
FIG. 2 is a block diagram of a transimpedance amplifier according to a known art.
Figure 3:
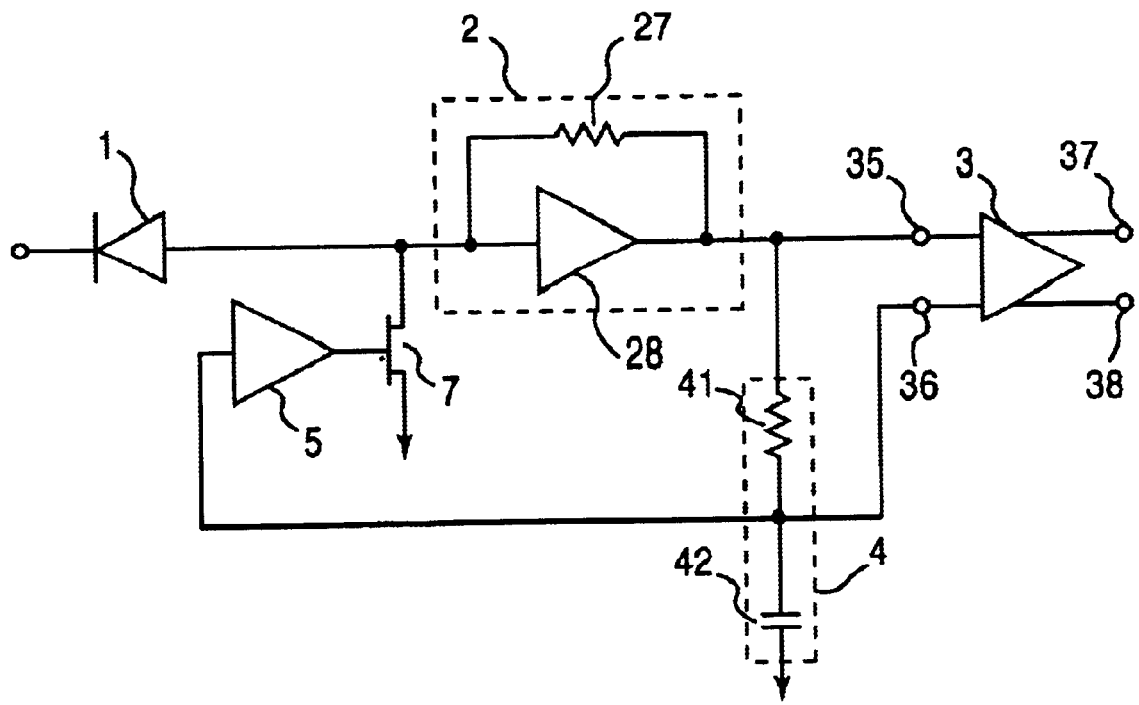
FIG. 3 is a block diagram of an amplifier circuit according to another known art.

FIG. 1 shows a semiconductor amplifier circuit according to an embodiment of the present invention. In this figure, parts having the same functions as in FIG. 3 are referred to with the same reference numerals. In FIG. 1, a transimpedance amplifier 2 includes a constant current source 21 as an input stage, an FET 22, level shift diodes 23, an FET 24 as an output stage, a level shift diode 25, a current source 26, and a feedback resistor 27 for connecting the input stage and the output stage.

In FIG. 1, a current signal input from a light-receiving element 1 to the gate of the FET 22 is transmitted through the feedback resistor 27 to the current source 26 so that a potential difference is generated at both ends of the feedback resistor 27. The gate-source potential of the FET 22 is kept to be constant by the constant current source 21, and thus the gate potential of the FET 22 is also kept to be constant. As a result, a voltage signal in inverse phase to that of the current signal is output from an output terminal of the transimpedance amplifier 2.

The output terminal of the transimpedance amplifier 2 is connected to a differential amplifier 3 and a DC voltage generating circuit 4. The differential amplifier 3 includes resistors 31, FETs 32 and 33, and a constant current source 34. The voltage signal output from the transimpedance amplifier 2 is input to the gate of the FET 32 through a signal input terminal 35.

The DC voltage generating circuit 4 includes a resistor 41 and a capacitor 42 and generates a DC voltage which is equal to the time-average voltage signal output from the transimpedance amplifier 2. The DC voltage is input to a reference-voltage input terminal 36 which is the other input terminal for the differential amplifier 3 and is supplied to an inverter 5 through a resistor 9.

The inverter 5 includes an FET 51, a resistor 52, and level shift diodes 53 and 54. The resistor 52 is used for adjusting the gain of the inverter 5. The level shift diode 53 is used for adjusting the output voltage of the inverter 5 and the level shift diode 54 is used for adjusting the gate bias point of the FET 51.

A by-pass transistor 7 is connected to an input terminal of the transimpedance amplifier 2 such that the by-pass transistor 7 is connected in series to level shift diodes 8. The output voltage of the inverter 5 is input to the gate of the by-pass transistor 7 via a level shift circuit 6.

In the above-described configuration, the gate potential of the by-pass transistor 7 varies in the same phase as the current signal input to the transimpedance amplifier 2. Thus, the gate potential of the by-pass transistor 7 decreases when the amplitude of the current signal input from the light-receiving element 1 is small. In this case, by setting the level shift circuit 6 so that the gate potential of the by-pass transistor 7 is lower than the threshold voltage, the impedance of the by-pass transistor 7 becomes high. Accordingly, a large amount of current signal is transmitted to the feedback resistor 27, without being transmitted to the by-pass transistor 7. As a result, the gain of the transimpedance amplifier 2 becomes high.

On the other hand, when the amplitude of the current signal input from the light-receiving element 1 is large, the gate potential of the by-pass transistor 7 increases so as to exceed the threshold voltage. Accordingly, the impedance of the by-pass transistor 7 becomes low. As a result, since part of the current signal transmits through the by-pass transistor 7, the gain of the transimpedance amplifier 2 becomes low.

As described above, the gain of the transimpedance amplifier 2 is adjusted in accordance with the intensity of the current signal input from the light-receiving element 1, and thus a high gain and a wide dynamic range can be obtained when the current signal is weak.

In the above-described configuration, the gate potential of the FET 51 used as the input unit of the inverter 5 has a inverse phase to that of the current signal input to the transimpedance amplifier 2. Accordingly, the gate potential of the FET 51 becomes high when the amplitude of the current signal is small. In this case, gate leakage current is generated when the gate potential of the FET 51 exceeds the threshold voltage, but this gate leakage current can be suppressed by the resistor 9. Therefore, the current applied to the resistor 41 of the DC voltage generating circuit 4 causes only a slight voltage reduction, and as a result, reduction in the DC voltage applied to the reference-voltage input terminal 36 of the differential amplifier 3 is suppressed. Accordingly, normal voltage signals without distortion are externally output from the output terminals 37 and 38 of the differential amplifier 3.

Also, as described above, the gate capacitance of the by-pass transistor 7 must be reduced in order to suppress deterioration in the frequency characteristic of the amplifier circuit caused by the gate capacitance of the by-pass transistor 7. However, the impedance of the by-pass transistor 7 in a low-frequency region increases by narrowing the gate width. As a result, the gain of the transimpedance amplifier 2 cannot be sufficiently reduced when the amplitude of the current signal becomes large, and thus the dynamic range is limited.

In this embodiment, the drain-source potential of the by-pass transistor 7 is limited to a value that is lower than the drain current saturation region by the level shift diodes 8 connected in series to the by-pass transistor 7. Thus, the impedance of the by-pass transistor 7 is kept to be low even when the gate width becomes narrow. Consequently, the impedance of the by-pass transistor 7 is kept to be sufficiently low and the gain of the transimpedance amplifier 2 decreases and the dynamic range becomes wide, even when the amplitude of the current signal is large and the gate potential of the by-pass transistor 7 increases so as to exceed the threshold voltage.

According to the above-described configuration, the gate capacitance can be reduced by narrowing the gate width of the by-pass transistor 7, and thus deterioration in a frequency characteristic of the amplifier circuit in a high-frequency region can be prevented.

As described above, according to the present invention, the amplifier having a high-gain and a wide dynamic range and having an excellent frequency characteristic can be achieved, and the performance of a receiver for optical communication can be improved.

What is claimed is:

1. A semiconductor amplifier circuit comprising:

a transimpedance amplifier for amplifying an input signal;

a by-pass transistor connected between an input terminal of the transimpedance amplifier and the ground potential;

a first resistor, one end of the first resistor being connected to an output terminal of the transimpedance amplifier;

a capacitor connected between the other end of the first resistor and the ground potential;

a second resistor connected between the other end of the first resistor and the gate of the by-pass transistor via an inverter; and a differential amplifier having a signal input terminal connected to the output terminal of the transimpedance amplifier and a reference-voltage input terminal connected to the other end of the first resistor.

2. The semiconductor amplifier circuit according to claim 1, further comprising level shift means provided at least one of between the by-pass transistor and the input terminal of the transimpedance amplifier and between the by-pass transistor and the ground potential.

3. The semiconductor amplifier circuit according to claim 2, wherein the level shift means is a diode.

4. The semiconductor amplifier circuit according to claim 1, wherein a light-receiving element is connected to the input terminal of the transimpedance amplifier.

* * * * *